US008684067B1

(12) United States Patent
Frame

(10) Patent No.: US 8,684,067 B1
(45) Date of Patent: Apr. 1, 2014

(54) SUSPENDED PANEL SYSTEM

(71) Applicant: Polargy, Inc., Sunnyvale, CA (US)

(72) Inventor: Cary Frame, Menlo Park, CA (US)

(73) Assignee: Polargy, Inc., Suunyvale, CA (US)

( * ) Notice: Subject to any disclaimer, the term of this patent is extended or adjusted under 35 U.S.C. 154(b) by 0 days.

(21) Appl. No.: 13/782,496

(22) Filed: Mar. 1, 2013

Related U.S. Application Data

(60) Provisional application No. 61/723,049, filed on Nov. 6, 2012.

(51) Int. Cl.
    *E04B 2/00* (2006.01)
(52) U.S. Cl.
    USPC ...... 160/330; 160/368.1; 52/36.6; 52/506.07; 52/506.03; 248/339; 248/340
(58) Field of Classification Search
    USPC ............ 52/506.01, 506.03–506.07, 235, 836, 52/843, 846, 506.03–506.07, 34.4–36.6; 312/245–246, 107–108; 108/48, 152; 248/205.1, 298.1, 235, 429, 317, 248/339–340; 211/94.01; 160/330, 345, 160/368.1, 369
    See application file for complete search history.

(56) References Cited

U.S. PATENT DOCUMENTS

| | | | | |
|---|---|---|---|---|
| 4,191,352 A | * | 3/1980 | Schuplin | 248/317 |
| 5,146,723 A | * | 9/1992 | Greenwood et al. | 52/288.1 |
| 5,217,057 A | * | 6/1993 | Hubbard et al. | 160/345 |
| 5,515,902 A | * | 5/1996 | Hoffman | 160/235 |
| 6,113,201 A | * | 9/2000 | Bauer | 312/245 |
| 7,104,023 B1 | * | 9/2006 | Holztrager | 52/705 |
| 7,637,065 B2 | * | 12/2009 | Ahren et al. | 52/506.06 |
| 7,874,116 B2 | * | 1/2011 | LaLonde | 52/506.08 |
| 8,434,835 B2 | * | 5/2013 | Hardy et al. | 312/245 |
| 2008/0120936 A1 | * | 5/2008 | Hull | 52/483.1 |
| 2012/0018103 A1 | | 1/2012 | Ashelin et al. | |

OTHER PUBLICATIONS

"Instor Products Airflow Containment," at least as early as Oct. 16, 2013, pp. 1-3, Instor Solutions, available at http://www.instor.com/products/green.htm.
"JC Sharp Operable Walls," at least as early as Oct. 16, 2013, pp. 1-2, JC Sharp Corp., available at http://foldingpartitions.net/operable.shtml.
"Cornell Iron Works—Product Comparison Chart—Side Folding Accordion Partitions," dated at least as early as Dec. 31, 2008, pp. 1-3, Cornell Iron Works, Inc., available at http://www.cornelliron.com/comparison.html.

(Continued)

*Primary Examiner* — Jeanette E. Chapman
(74) *Attorney, Agent, or Firm* — Brinks Gilson & Lione

(57) ABSTRACT

A suspended panel system for vertically hanging a panel is provided. The suspended panel system can include a first connector having a panel mounting portion configured to be coupled to a first edge portion of a panel. The first connector can include a first hook having a first channel open toward the panel. The suspended panel system can also include a second connector configured to be coupled to a mounting surface above the panel. The second connector can include a second hook having a second channel open away from the panel such that the first hook and the second hook removably engage one another by having the first hook engage the second channel and the second hook engage the first channel.

20 Claims, 8 Drawing Sheets

(56) References Cited

OTHER PUBLICATIONS

"Made-in-China.com Acoustic Ceilings—Hanging Acoustic Ceiling," at least as early as Oct. 16, 2013, pp. 1-2, Guangzhou Liyin Building Material Co. Ltd., available at http://cnliyin.en.made-in-china.com/product/joTmJUwvLFcC/China-Acoustic-Ceilings-Hanging-Acoustic-Ceiling.html.

"Nova Display Innovative Display Solutions—Office Partition," at least as early as Oct. 16, 2013, p. 1, Nova Display, Inc., available at www.novadisplay.com/wholesale/office-partitions-suspended.html. Photograph of Gordon Ceilings Device, dated Sep. 30, 2012, p. 1, Gordon Ceilings, AFCOM Data Center World Trade Show, Las Vegas, Nevada.

* cited by examiner

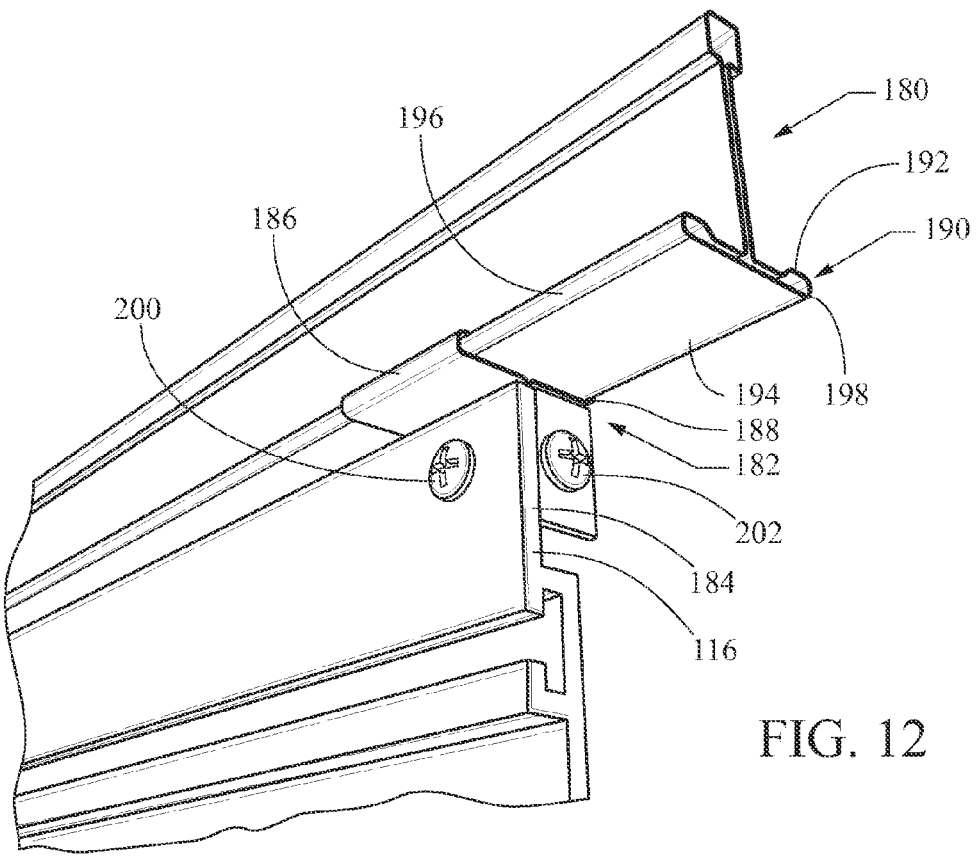
FIG. 12
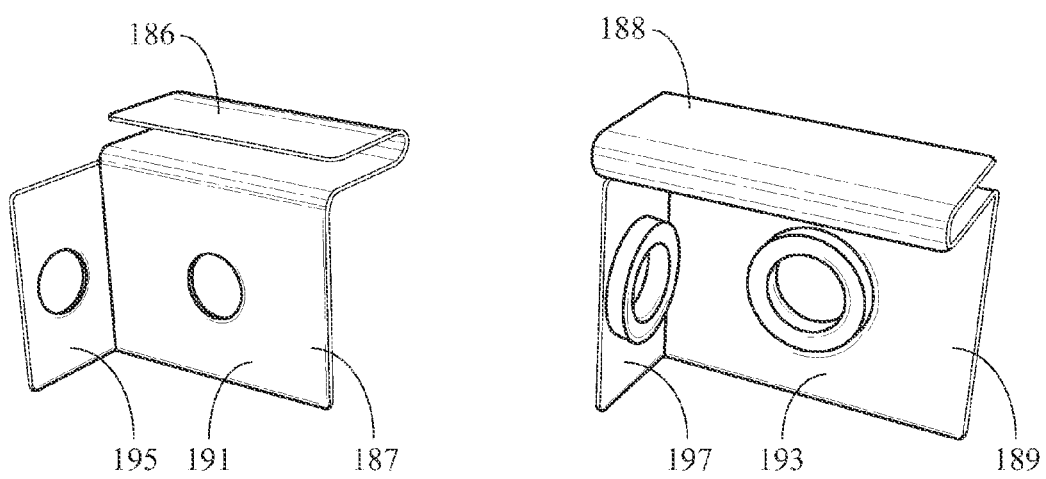
FIG. 13A
FIG. 13B

SUSPENDED PANEL SYSTEM

RELATED APPLICATIONS

This application claims priority under 35 U.S.C. §119(e) to U.S. Provisional Application No. 61/723,049, "SUSPENDED PANEL SYSTEM" filed Nov. 6, 2012, the entire contents of which are incorporated by reference.

BACKGROUND

1. Field

The present disclosure generally relates to suspended panel systems for vertically hanging panels to serve as removable walls or barriers.

2. Description of the Related Art

Panel systems with removable walls and barriers are often used as architectural partition systems and as data center containment systems. For example, architectural partition systems are often used as room dividers to divide a room into separated spaces. Data center containment systems are typically used to contain computer systems such as computer server racks. In order to prevent computer systems from overheating, computer systems are generally cooled. Instead of cooling the entire room that the computer system is in, a containment system can confine the computer system to a smaller space so that cooling can be focused on the space within the containment system. Panel systems can be fixed to a ceiling or a surface above the panel system with fasteners, such as screws and bolts, and require tools to attach and remove walls.

SUMMARY

A suspended panel system for vertically hanging a panel is provided. The suspended panel system can include a first connector having a panel mounting portion configured to be coupled to a first edge portion of a panel. The first connector can include a first hook having a first channel open toward the panel. The suspended panel system can also include a second connector configured to be coupled to a mounting surface above the panel. The second connector can include a second hook having a second channel open away from the panel such that the first hook and the second hook removably engage one another by having the first hook engage the second channel and the second hook engage the first channel.

In a further example, a suspended panel system can include a panel hung vertically such that a first edge portion of the panel is at a top of the panel. The suspended panel system can also include first connector having a panel mounting portion coupled to a first edge portion of a panel. The first connector can include a first hook having a first channel open toward the panel. The suspended panel system can further include a second connector coupled to a mounting surface above the panel. The second connector can include a second hook having a second channel open away from the panel such that the first hook and the second hook removably engage one another by having the first hook engage the second channel and the second hook engage the first channel.

In another example, a method of providing air flow isolation to an enclosed space is provided. The method can include coupling a first edge portion of a panel to a panel mounting portion of a first connector. The first connector can include a first hook having a first channel that is open toward the panel. The method can further include coupling a second connector to a mounting surface. The second hook can include a second hook having a second channel that is open away from the panel. The method can also include engaging the first hook and the second hook together such that the first hook and the second hook removably engage one another by having the first hook engage the second channel and the second hook engage the first channel.

Further objects and advantages of the present invention will be apparent from the following description, reference being made to the accompanying drawings wherein embodiments of the present invention are shown.

BRIEF DESCRIPTION OF THE DRAWINGS

The embodiments can be better understood with reference to the following drawings and description. The components in the figures are not necessarily to scale, emphasis instead being placed upon illustrating the principles of the present disclosure. Moreover, in the figures, like-referenced numerals designate corresponding parts throughout the different views.

FIG. 12 is a partial perspective view of one embodiment of a suspended panel system depicting a T-bar mounting clip used to secure the suspended panel system to a T-bar runner in a suspended ceiling grid;

FIG. 13A is a perspective view of one embodiment of a first clip of a T-bar mounting clip; and FIG. 13B is a perspective view of one embodiment of a second clip of a T-bar mounting clip.

DETAILED DESCRIPTION

Figure 1:
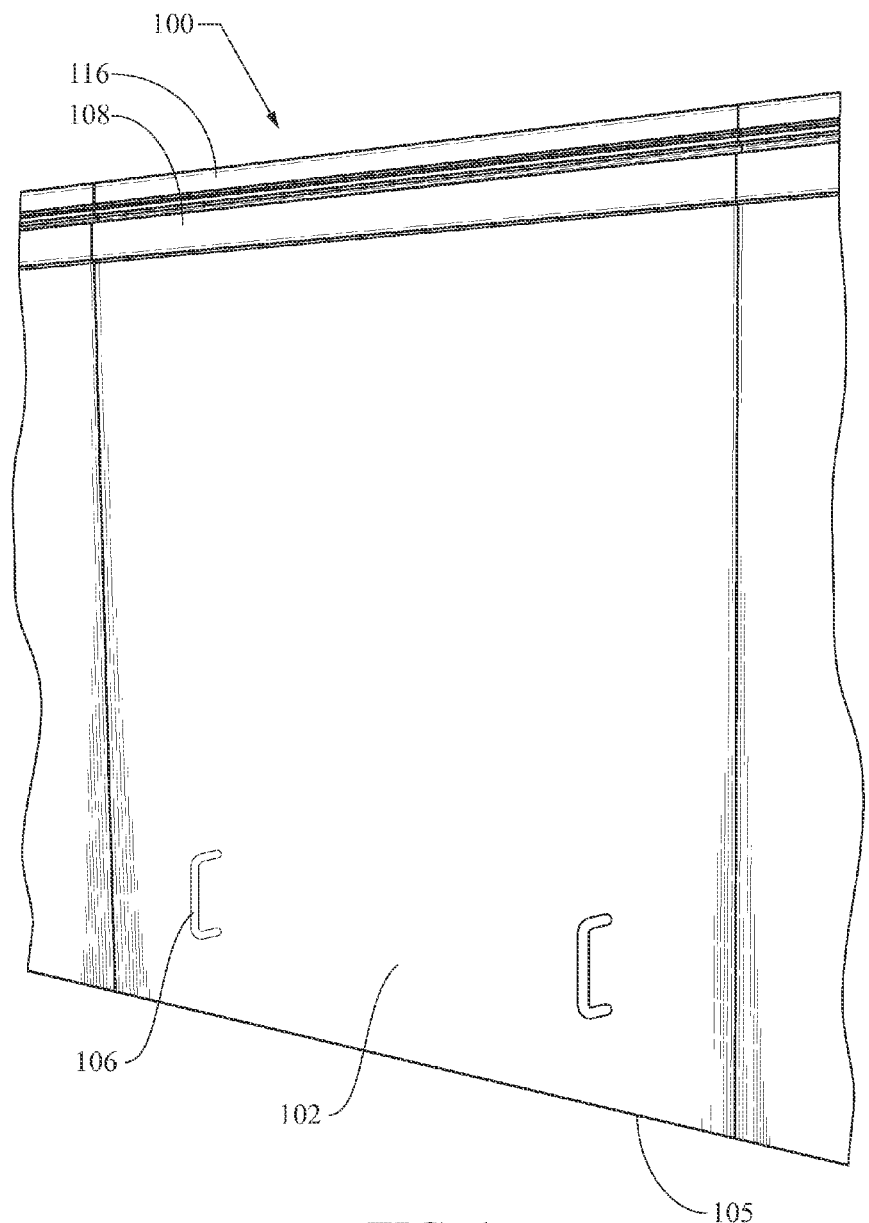
FIG. 1 is a perspective view of one embodiment of a suspended panel system depicting the suspended panel system after the panel has been hung.

For the purposes of promoting an understanding of the principles of the present disclosure, reference will now be made to the embodiments illustrated in the drawings, and specific language will be used to describe the same. It should nevertheless be understood that no limitation of the scope of the invention is thereby intended, such alterations and further modifications in the illustrated examples, and such further applications of the principles of the present disclosure as illustrated therein being contemplated as would normally occur to one skilled in the art to which the present disclosure relates.

Suspended panel systems described herein can include panels that are easily and quickly removable. For example, after a connector of the system is coupled to a surface such as a ceiling, the panels can be hung or installed and taken down or uninstalled without tools. Even though the panels can be easily removed, the suspended panel systems can provide air or gas flow isolation between a first side and a second side of the panel. In particular, suspended panel systems can be used to define space or volume that is fluidly isolated from another space or volume. For example, a suspended panel system can be installed so that panels can surround one or more computer systems to provide air flow isolation between the computer system and the rest of the room. Therefore, the computer system can be cooled without having to cool the rest of the room and energy can be saved. Air flow isolation is described herein and is not intended to mean complete isolation from air flow. Structures described herein can still include some gaps or spaces that some air can flow through, but even with those gaps, air flow from one side of the suspended panel system to the other side can be substantially eliminated. Furthermore, typical applications of suspended panel systems, such as providing air flow isolation around a computer system, does not require complete isolation to provide substantial energy savings.

Referring to FIGS. 1-4, a suspended panel system 100 can include at least one panel 102. The panel 102 can be configured to be hung vertically such that a first edge portion 104 (shown in FIG. 2) of the panel 102 is configured to be at a top of the panel 102 when the panel 102 is hung. A second edge 105 (shown in FIG. 1) of the panel 102 can be configured to be at a bottom of the panel 102 when the panel 102 is hung. The panel 102 can be rigid or formed from a rigid material that prevents air flow through the panel and low thermal conductivity. Furthermore, the panel 102 can be lightweight so that panel 102 can be moved by a user. For instance, the panel 102 can be a polymer, such as polycarbonate or poly(methyl methacrylate). Furthermore, the panel 102 can have a single wall or more than one wall. For example, one or more gaps can be formed between two walls that form the panel 102 such as a twin wall panel. The gaps can provide additional thermal insulation to the panel 102. The panel 102 can be various dimensions depending on a particular application. For example, the panel 102 can have a thickness of about 4 mm to about 16 mm or a thickness of about 8 mm, or any other thickness. The suspended panel system 100 can also include handles 106 (shown in FIG. 1) coupled to the panel 102 that a user can use to grab and move the panel 102.

The suspended panel system 100 can include a first connector 108 coupled to the first edge portion 104 of the panel 102. For example, the first connector 108 can include a panel mounting portion, such as a mounting channel 110, that the first edge portion 104 is engaged within. Furthermore, the first connector 108 and the panel 102 can be provided separately so that a panel 102 can be selected, cut, or otherwise sized based on a particular application, and then be attached to the first connector 108. For example, different rooms can have different heights. Therefore, a room height can be measured and an appropriate length panel 102 can be selected and attached to the first connector 108. The first connector 108 can receive the panel 102 as the panel 102 is slid into the mounting channel 110.

The first connector 108 can include a first hook 112 having a first channel 114 open toward the panel 102. A second connector 116 can be configured to be coupled to a mounting surface above the panel 102 such as a ceiling, rafters, rails, or to any other surface or fixture. The second connector 116 can be coupled to the mounting surface by various means such as screws, bolts, brackets, or any other fasteners. The second connector 116 can include a second hook 118 that has a second channel 120 open away from the first edge portion 104 of the panel 102, such as toward the mounting surface above the panel 102. With the first channel 114 and the second channel 120 open in opposite directions, the first hook 112 and the second hook 118 can removably engage one another to vertically support the panel 102.

The first hook 112 can be configured to have the panel 102 hung substantially vertical when engaged with the second hook 118. For example, the first channel 114 can be partially or completely within a plane of the panel 102. Furthermore, the first channel 114 can have a first depth and the second channel 120 can have a second depth less than the first depth. Therefore, the gravitational force of the panel 102, when hung, can be supported between an end portion 122 of the first hook 112 and a bottom 124 of the second channel 120. Therefore, the end portion 122 of the first hook 112 can reside along a vertical center of gravity of the panel 102 such that when the first hook 112 and the second hook 118 engage one another, the panel 102 hangs substantially vertical. However, the system 100 can have other configurations that facilitate the panel 102 to be hung vertically. For example, the end portion 123 of the second hook 118 can instead bear the weight of the panel 102 against the bottom 125 of the first channel 114. In another example, both of the end portions 122, 123 of the first and second hooks 114, 118 can bear the weight of the panel 102 against the second and first channels 120, 114, respectively. In any of these examples, the first hook 112 and the second hook 118 can be configured to have the portion or portions of the hooks 112, 118 that bear the weight of the panel 102 to be along the vertical center of gravity of the panel 102 so that the panel 102 hangs substantially vertical.

In an alternative example, neither of the hooks 112, 118 bears the weight of the panel 120. Instead, the second edge 105 of the panel 102 can be supported by the floor or other surface, and the first connector 108 holds the panel 102 upright. The hooks 112, 118 can limit movement of the first connector 108 with respect to the second connector 116.

Figure 3:
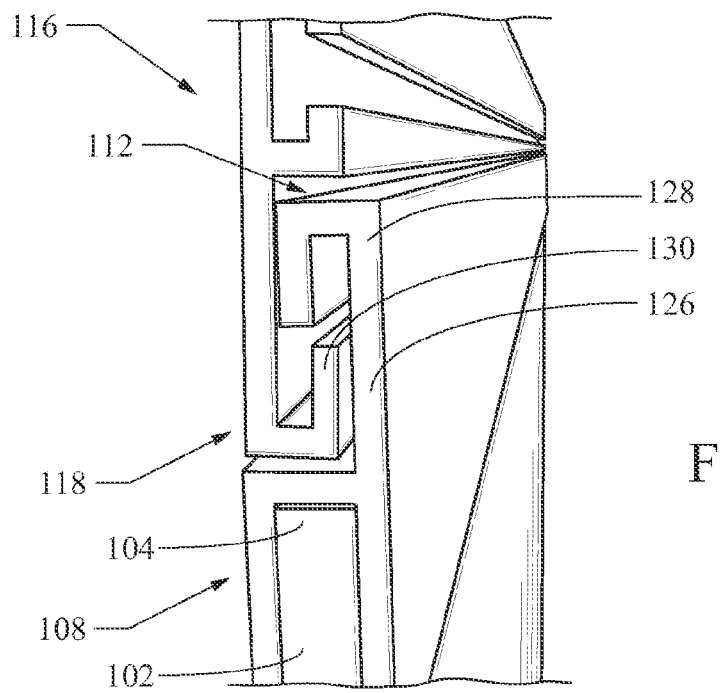
FIG. 3 is a partial perspective view of an end of a suspended panel system depicting hooks that are disengaged from one another.

In order for the end portion 122 of the first hook 112 to be along a plane that the panel 102 lies along, the first hook 112 can extend from a first side 127 of the panel 102, bend or curve toward a second side 129 of the panel 102, and the end portion 122 can extend toward the panel 102. The end portion 122 of the first hook 112 can be spaced away from panel 102 so that the end portion 123 of the second hook 118 can fit into the space between the end portion 122 of the first hook 112 and the panel 102. When a portion of the first connector 108, such as a panel mount 109, which is described later, is between the end portion 122 of the first hook 112 and the panel 102, the end portion 122 can be spaced away from the portion of the first connector 108 that is between the end portion 122 and the panel 102. The end portion 123 of the second hook 118 can be moved through the space so that the first hook 112 and the second hook 118 can engage one another. For example, the first hook 112 can have a J-shape. FIG. 3 is a close-up view of the first hook 112 and the second hook 118 positioned immediately prior to engagement of the first hook 112 and the second hook 118 or immediately after disengagement of the first hook 112 and the second hook 118. The leg 126 of the J-shape that extends from the first edge portion 104 of the panel 102 to the hook portion 128 can have a length at least as great as the end portion 130 of the second hook 118.

Figure 4:
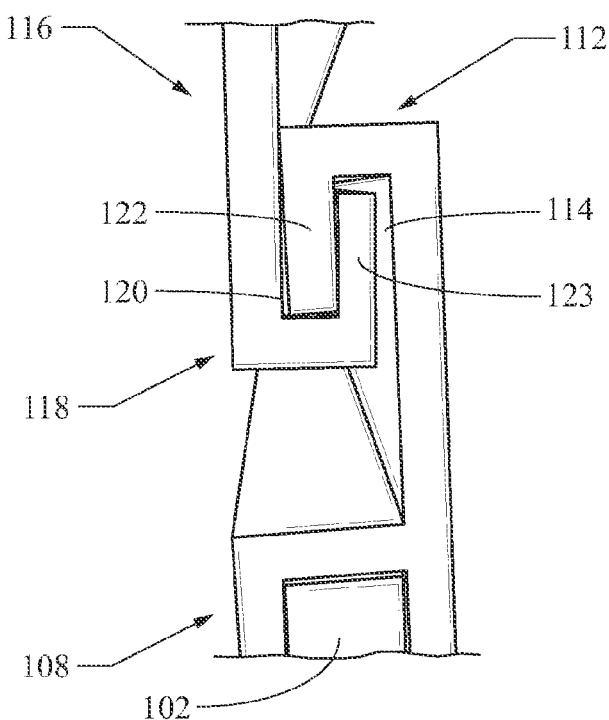
FIG. 4 is a partial perspective view of an end of a suspended panel system depicting that hooks can be angled related to one another to make engagement of the hooks easier.

As described above, the end portion 122 of the first hook 112 engages the second channel 120 of the second hook 118, and the end portion 123 of the second hook 118 engages the first channel 114 of the first hook 112. Therefore, the first channel 114 can have a width greater than a width of the end portion 123 of the second hook 118, and the second channel 120 can have a width greater than a width of the end portion 122 of the first hook 112. When the first hook 112 and the second hook 118 are engaged, there can be a space between the end portion 122 of the first hook 112 and a wall of the second channel 120 and a space between end portion 123 of the second hook 118 and a wall of the first channel 114. For example, the width of the end portion 122 of the first hook 118 can be less than about 90% of the width of the second channel 120 and the width of the end portion 123 of the second hook 118 can be less than about 90% of the width of the first channel 114. With the end portions 122, 123 being narrower than the channels 114, 120, the first and second hooks 112, 118 can be easier to engage. For instance, FIG. 4 shows the first connector 108 angled relative to the second connector 116. Therefore, the panel 102 can be more easily hung since the first and second hooks 112, 118 can engage one another even though the panel 102 may not be completely vertical.

Figure 2:
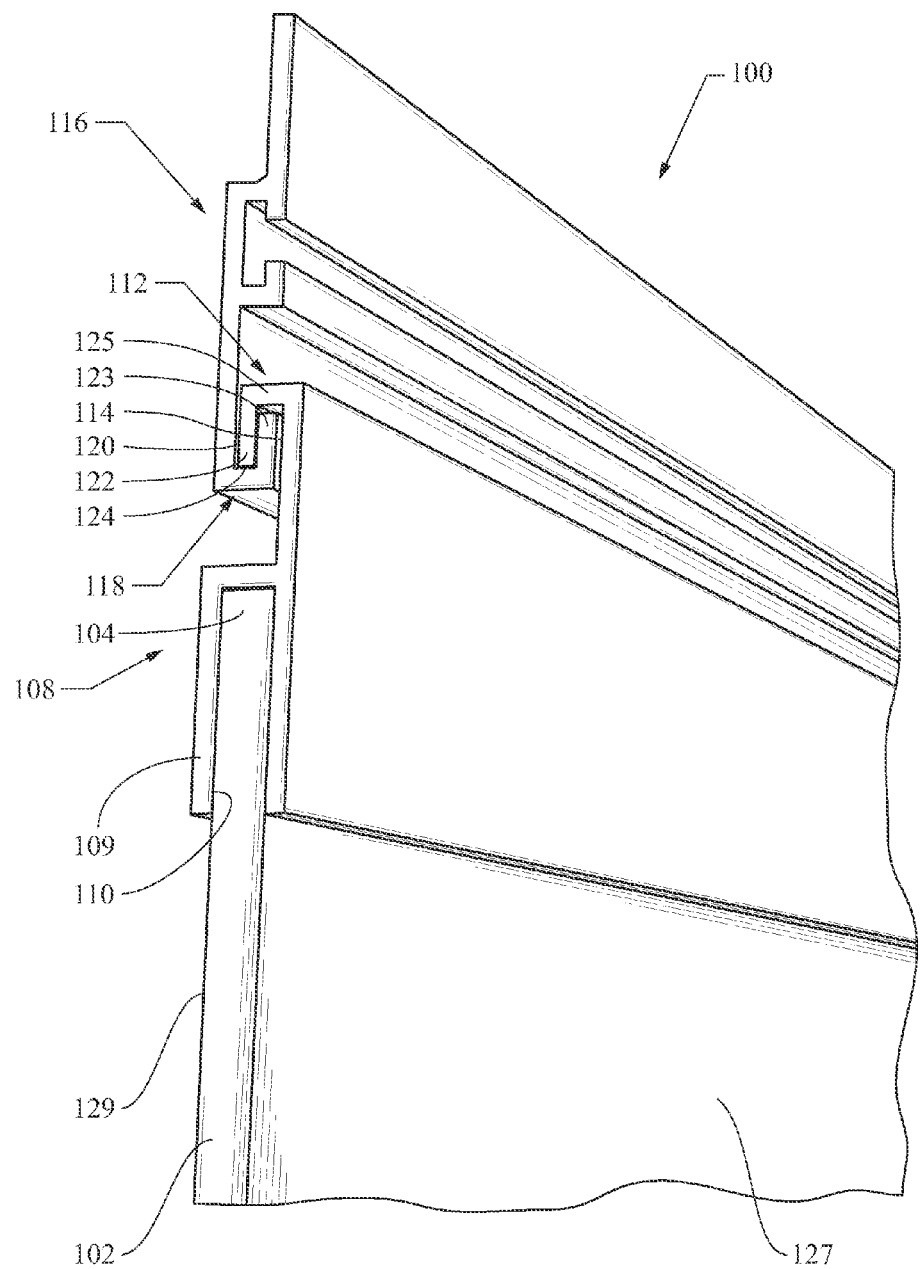
FIG. 2 is a partial perspective view of an end of a suspended panel depicting engagement of hooks that support the suspended panel.
Figure 5:
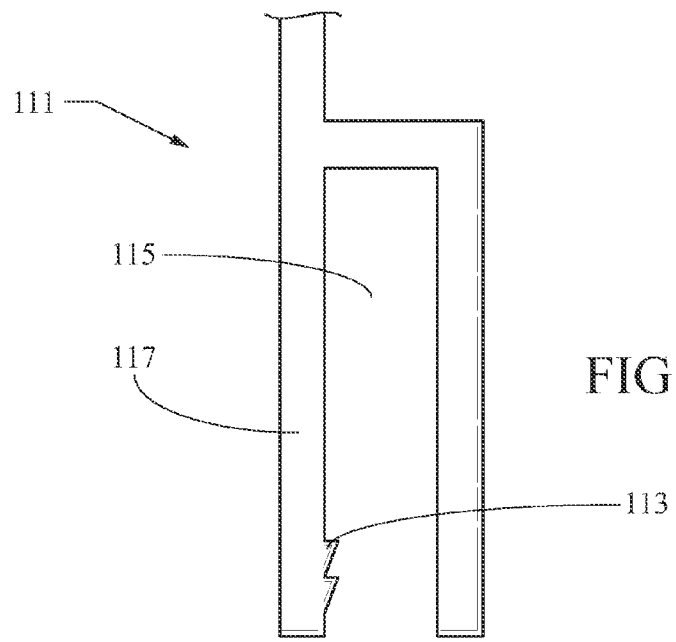
FIG. 5 is a partial end view of one embodiment of a connector depicting teeth within a mounting channel for engaging a panel.

As illustrated in FIG. 2, the first connector 108 can include a panel mount 109 to couple the first connector 108 to the first edge portion 104 of the panel 102. For example, the panel mount 109 can include a mounting channel 110 such that the first edge portion 104 of the panel 102 is engagable with the mounting channel 110. In one example, the first edge portion 104 can snugly fit in the mounting channel 110 such that there is sufficient friction between the first edge portion 104 and the mounting channel 110 so that the panel 102 does not fall out of the mounting channel 110 when the panel 102 is hung. FIG. 5 illustrates another example of a first connector 111 similar to the first connector 108 illustrated in FIGS. 2-4. However, the first connector 111 in FIG. 5 further includes one or more teeth 113 such as one or more teeth within the mounting channel 115 of the panel mount 117. The teeth 113 can engage with the first edge portion 110 of the panel 102 to restrict removal of the panel 102 from the mounting channel 115.

Figure 6:
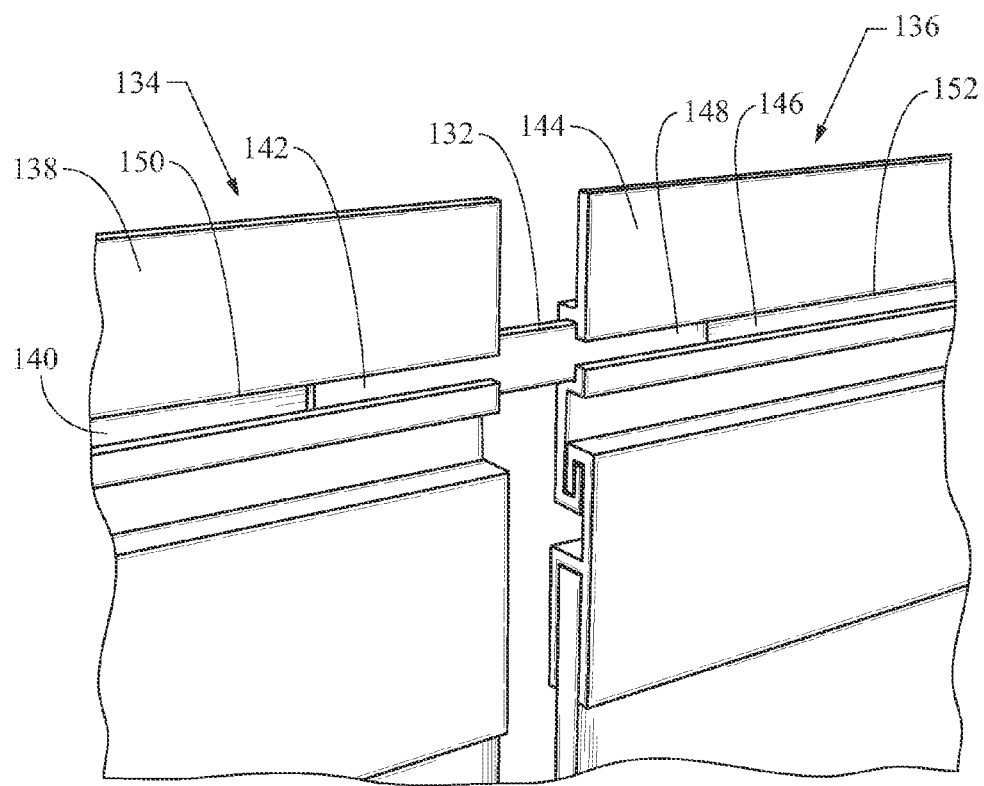
FIG. 6 is a partial perspective view of one embodiment of suspended panel systems having a splicer extending between connectors of the systems to couple and align the suspended panel systems together.

Two or more suspended panel systems 100 can be used together. When two or systems 100 are used, the systems 100 can be simply positioned adjacent to or next to one another end to end. However, the systems 100 that are adjacent to one another can include an attachment member, such as a splicer, that helps to hold and align the adjacent systems 100 together. FIG. 6 illustrates one example of a splicer 132 between a first system 134 and a second system 136. The first system 134 includes a second connector 138 that has a splicer channel 140 configured to engage the splicer 132. For example, the splicer 132 can be an elongated member with a first end portion 142 that has a cross-section similar to the splicer channel 140 so that the first end portion 142 can slide into the splicer channel 140. The second system 136 can similarly include a second connector 144 that has a splicer channel 146 configured to engage the splicer 132. The splicer can have a second end portion 148 that has a cross-section similar to the splicer channel 146 so that the second end portion 148 can slide into the splicer channel 146. The splicer channels 142, 146 can further have a slot 150, 152 so that splicer 132 can be viewed when the first and second systems 134, 136 are positioned adjacent to one another.

Figure 7:
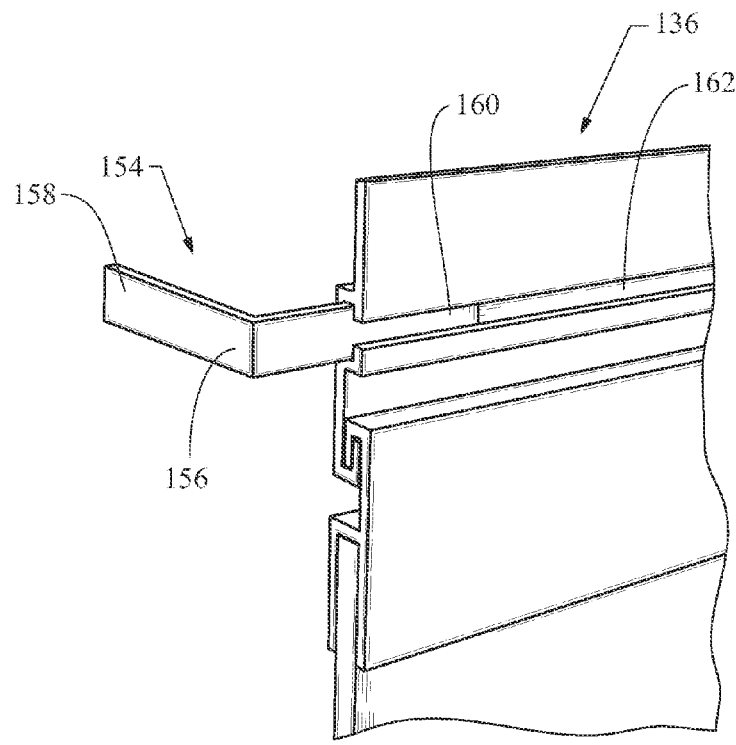
FIG. 7 is a partial perspective view of one embodiment of a suspended panel system having a splicer configured to extend between suspended panel systems that include panels that are perpendicular to one another.

The splicer 132 illustrated in FIG. 6 is configured to extend between two systems 134, 136 that include panels substantially parallel to one another that are end to end. Adjacent systems that include panels that are nonparallel to one another can use similar splicer channels discussed above except the splicer 132 can be configured differently. For example, FIG. 7 illustrates a splicer 154 that is configured to extend between a first system (not shown) and a second system 156 that are perpendicular to one another. For instance, the splicer 154 has a right angle bend 156 between a first end portion 158 and a second end portion 160. The first end portion 158 can be inserted into the splicer channel of the first system and the second end portion 160 can be inserted into the splicer channel 162 of the second system 156.

The panel 102 can be hung without an attachment on the floor. For example, a second edge 105 of the panel 102 that is configured to be at the bottom of the panel 102 when the panel 102 is hung can be free such that the second edge 105 is movable. In particular, the second edge 105 of the panel 102 can be spaced from the floor to provide up and down motion after the system 100 has been installed. For example, the up and down motion can result from movement of the building such as the roof moving or flexing under weather conditions. Alternatively, the system 100 can include a securing member discussed below.

Figure 8:
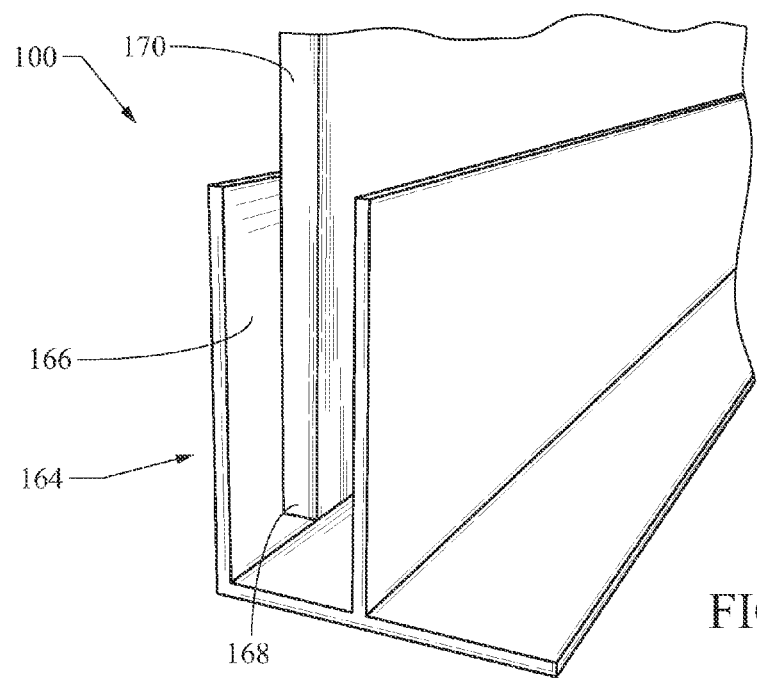
FIG. 8 is a partial perspective view of one embodiment of a suspended panel system depicting a securing member engaged with a bottom edge of a panel.

FIG. 8 illustrates an example of the suspended panel system 100 that includes a securing member 164 configured to be coupled to a second mounting surface (not shown) and having a channel 166 configured to engage/receive the second edge portion 168 of the panel 170. The panel 170 can be installed by inserting the second edge portion 168 into the channel 166 of the securing member 164 and then engaging the first and second hooks 112, 118. The panel 170 and the securing member 164 can be configured so that second edge portion 168 of the panel 170 does not contact the bottom of the channel 166 when the panel 170 is hung, creating a space between the bottom of the channel 166 and the panel 170. As discussed above, the space can facilitate up and down motion of the panel 170. In addition, the channel 166 of the securing member 164 can have a width that is greater than a width of the second edge portion 168 of the panel 170 in order to facilitate installation. For example, the width of the second edge portion 168 of the panel can be less than about 90% of the width of the channel 166 of the securing member 164.

Figure 9:
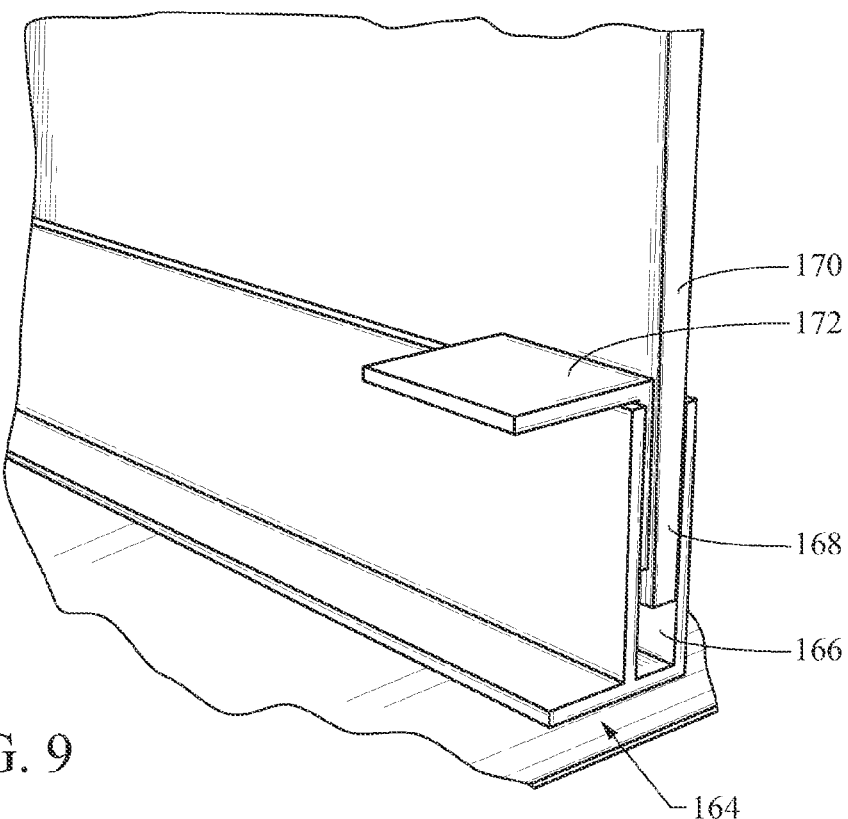
FIG. 9 is a partial perspective view of one embodiment of a suspended panel system showing an L-bracket in a channel of a securing member that is sandwiched between the panel and a wall of the channel to secure the panel.

The suspended panel system 100 can include an insert configured to be positioned or inserted within the channel 166 of the securing member 164. FIG. 9 illustrates an insert 172 positioned in the channel 166 with the second edge portion 168 within the channel 166 to restrict movement of the second edge 168. The insert 172 can have a cross-section that is L-shaped in order to be easily removed from the channel 166. The portion of the insert 172 that is configured to be inserted into the channel 166 can have a width similar to the difference between the width of the channel 166 and the width of the second edge portion 168 of the panel 170 to provide a snug fit.

Figure 10:
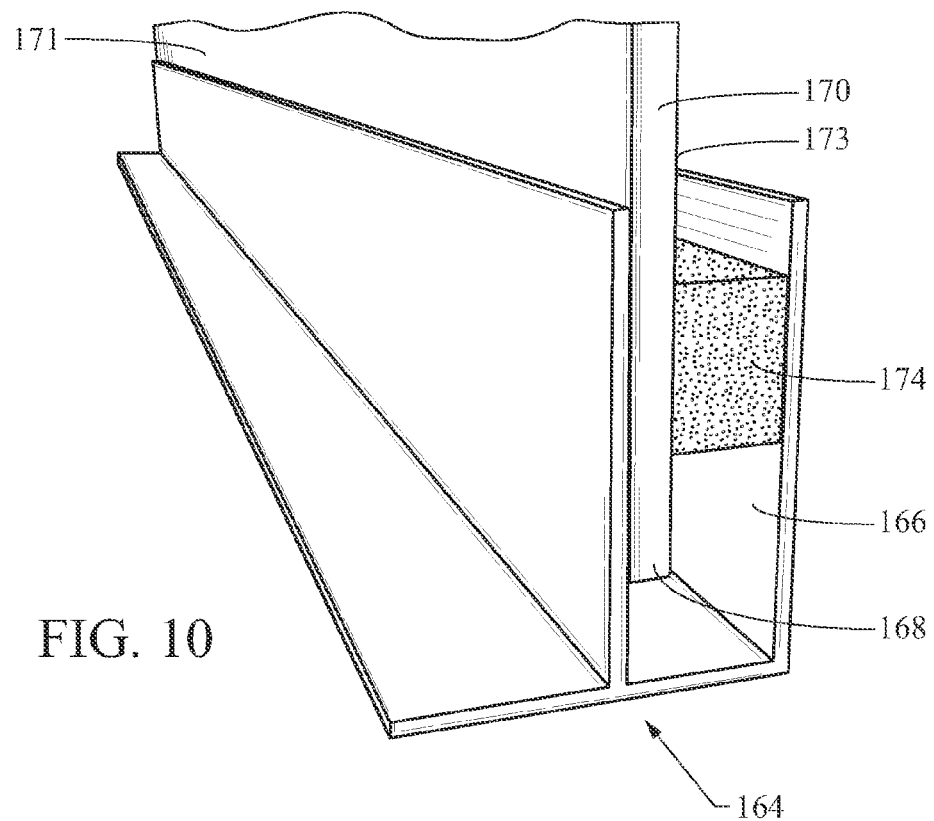
FIG. 10 is a partial perspective view of one embodiment of a suspended panel system showing an elongated foam member within a channel of a securing member that is sandwiched between a panel and a wall of the channel to secure the panel.

The securing member 164 can provide additional air flow restriction. For example, FIG. 10 illustrates another insert 174 that can be positioned within the channel 166 of the securing member 164. The insert 174 can be foam or other elastic material that can be sandwiched between the panel 170 and a wall of the channel 166 of the securing member 164. The insert 174 can be elongated so that insert can extend along the channel 166 to provide a substantially continuous barrier to air flow. Therefore, the insert 174 can prevent air from passing around the second edge portion 168 of the panel 170, thereby providing air flow isolation between the first side 171 and the second side 173 of the panel 170.

Figure 11:
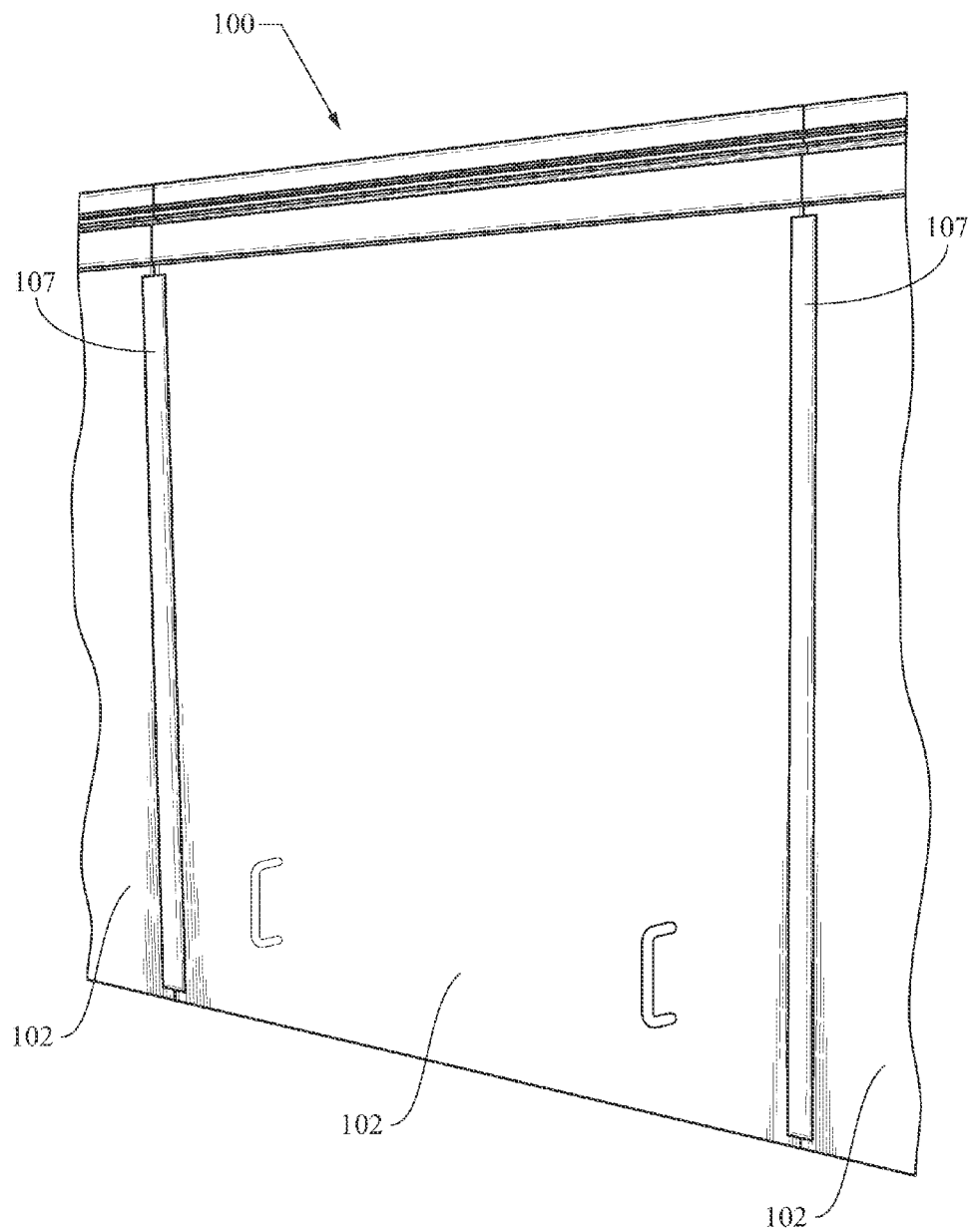
FIG. 11 is the suspended panel system of FIG. 1 depicting trim pieces that can be coupled to and extend between adjacent panels.

As described above, air flow can be restricted from passing around the first and second edge portions 104, 105 of the panel 102. However, adjacent or neighboring panels 102 can have a gap between the panels 102 that can facilitate some air flow. Therefore, the system 100 can include trim pieces 107 coupled to and extending between adjacent panels 102. FIG. 11 illustrates the trim pieces 107 attached to the panels 102. One or more trim pieces 107 can cover the gap to improve air flow isolation between one side and the other side of the panels. The trim pieces 107 can be T- or H-brackets that can be sandwiched between adjacent panels 102 that are parallel to one another. The panels 102 that are perpendicular to one another can include an L-bracket sandwiched between one another. Other types of pieces or sheets can also be used to cover the gap. The trim piece 107 can also be configured to be easily secured and removed from the panels 102. For example, a hook and loop fastener can be applied between the trim piece 107 and the panels 102.

The system 100 can also be coupled to a T-bar runner of a suspended ceiling grid. For example, FIG. 12 illustrates the second connector 116 coupled to the T-bar runner 180 with a T-bar mounting clip 182. The T-bar mounting clip 182 secures to the T-bar runner 180 of a suspended ceiling grid and provides a vertical surface 184 to which the second connector 116 can be coupled to. The T-bar mounting clip 182 can include one or more clips 186, 188 that wrap around the horizontal base 190 of the T-bar runner 180. The clips 186, 188 can extend from a top 192 to a bottom 194 of the horizontal base 190. For example, a first clip 186 can extend around a first side 196 of the horizontal base 190 and a second clip 188 can extend around a second side 198. The first clip 186 and the second clip 188 can meet along the bottom 194 of the horizontal base 190, and vertical portions 187, 189 of the first clip 186 and the second clip 188 can extend toward the second connector 116.

FIGS. 13A and 13B are perspective views of a first clip 186 and a second clip 188, respectively. The vertical portions 187, 189 can include a mounting section 191, 193 and a fastener section 195, 197 that can be generally perpendicular to the mounting section 191, 193. The first clip 186 and the second clip 188 can be coupled together at the fastener sections 195, 197 with a first fastener 202 such as a screw. A second fastener 200 such as a screw can be used to couple the second connector 116 to the T-bar mounting clip 182 at the mounting sections 191, 193. The T-bar mounting clip 182 can be mounted to the T-bar runner 180 with the first fastener 202 prior to mounting the second connector 116 to the T-bar mounting clip 182 with the second fastener 200. The T-bar mounting clip 182 can be slid along the T-bar runner 180 while the T-bar mounting clip 182 is mounted to the T-bar runner 180, which can allow for adjustment of the position of the T-bar mounting clip 182.

In accordance with the provisions of the patent statutes, the present invention has been described in what is considered to represent its preferred embodiment. However, it should be noted that the invention can be practiced otherwise than as specifically illustrated and described. Those skilled in the art will recognize that variations and modifications can be made without departing from the true scope and spirit of the invention as defined by the claims that follow. It is therefore intended to include within the invention all such variations and modifications as fall within the scope of the appended claims and equivalents thereof.

What is claimed is:

1. A suspended panel system for vertically hanging a panel, the suspended panel system comprising:
a first connector having a panel mounting portion configured to be coupled to a first edge portion of a panel, the first connector comprising a first hook having a first channel open toward the panel; and
a second connector configured to be coupled to a mounting surface above the panel, the second connector comprising a second hook having a second channel open away from the panel such that the first hook and the second hook removably engage one another by having the first hook engage the second channel and the second hook engage the first channel, wherein the first channel has a first depth and the second channel has a second depth less than the first depth.

2. The suspended panel system of claim 1, further comprising the panel being configured to be hung vertically such that the first edge portion of the panel is configured to be at a top of the panel when the panel is hung.

3. The suspended panel system of claim 2, wherein the first channel is at least partially within a plane of the panel.

4. The suspended panel system of claim 2, wherein first hook extends from a first side of the panel and bends toward a second side of the panel to form the first channel.

5. The suspended panel system of claim 3, wherein an end portion of the first hook is configured to be along a plane of a vertical center of gravity of the panel such that when the first hook and second hook engage one another, the panel hangs substantially vertical.

6. The suspended panel system of claim 1, wherein a distance between an end portion of the first hook and a portion of the first connector adjacent the first edge of the panel is greater than a length of the end portion of the second hook.

7. The suspended panel system of claim 1, wherein an end portion of the second hook has a width less than a width of the first channel, and an end portion of the first hook has a width less than a width of the second channel.

8. The suspended panel system of claim 1, wherein the panel mounting portion is a mounting channel configured to engage with the first edge portion of the panel.

9. The suspended panel system of claim 1, wherein the second connector is configured to be coupled to a ceiling.

10. The suspended panel system of claim 1, wherein the mounting surface is a first mounting surface, the suspended panel system further comprising a securing member configured to be coupled to a second mounting surface and comprising a channel configured to receive a second edge portion of the panel that is configured to be at a bottom of the panel when the panel is hung.

11. The suspended panel system of claim 10, wherein a width of the channel of the securing member is configured to be greater than a width of the second edge portion of the panel.

12. The suspended panel system of claim 11, further comprising a friction member configured to be insertable into the channel of the securing member while the second edge portion of the panel is within the channel of the securing member to restrict movement of the second edge portion.

13. The suspended panel system of claim 1, wherein the first connector comprises no other hooks other than the first hook.

14. The suspended panel system of claim 1, wherein the second connector comprises a splicer channel configured to receive a splicer that extends from the splicer channel to a splicer channel of another second connector that neighbors the second connector.

15. The suspended panel system of claim 1, further comprising a trim member configured to be removably coupled to and extend between the panel and another panel that neighbors the panel.

16. The suspended panel system of claim 1, in combination with one or more additional suspended panel systems to define an enclosed space.

17. The suspended panel system of claim 16, in further combination with one or more computer systems contained within the enclosed space.

18. The suspended panel system of claim 1, further comprising a T-bar mounting clip coupled to the second connector and configured to be mounted to a T-bar runner of a suspended ceiling grid.

19. A suspended panel system for vertically hanging a panel, the suspended panel system comprising:
 a panel hung vertically such that a first edge portion of the panel is at a top of the panel;
 a first connector having a panel mounting portion coupled to a first edge portion of a panel, the first connector comprising a first hook having a first channel open toward the panel; and
 a second connector coupled to a mounting surface above the panel, the second connector comprising a second hook having a second channel open away from the panel such that the first hook and the second hook removably engage one another by having the first hook engage the second channel and the second hook engage the first channel, wherein the first channel has a first depth and the second channel has a second depth different than the first depth.

20. A method of providing air flow isolation to an enclosed space, the method comprising:
 coupling a first edge portion of a panel to a panel mounting portion of a first connector, the first connector comprising a first hook having a first channel that is open toward the panel;
 coupling a second connector to a mounting surface, the second connector comprising a second hook having a second channel that is open away from the panel, wherein a distance between an end portion of the first hook and a portion of the first connector adjacent the first edge of the panel is greater than a length of the end portion of the second hook; and
 engaging the first hook and the second hook together such that the first hook and the second hook removably engage one another by having the first hook engage the second channel and the second hook engage the first channel.

* * * * *